US 12,412,806 B2

(12) United States Patent
Mitsui et al.

(10) Patent No.: US 12,412,806 B2
(45) Date of Patent: Sep. 9, 2025

(54) ELASTIC MEMBER AND ELASTIC DEVICE

(71) Applicant: MITSUBISHI STEEL MFG. CO., LTD., Tokyo (JP)

(72) Inventors: Yasuhiro Mitsui, Chiba (JP); Tomohiko Chosa, Chiba (JP); Toru Hirokane, Chiba (JP)

(73) Assignee: MITSUBISHI STEEL MFG. CO., LTD., Tokyo (JP)

( * ) Notice: Subject to any disclaimer, the term of this patent is extended or adjusted under 35 U.S.C. 154(b) by 0 days.

(21) Appl. No.: 18/869,509

(22) PCT Filed: May 30, 2023

(86) PCT No.: PCT/JP2023/020139
§ 371 (c)(1),
(2) Date: Nov. 26, 2024

(87) PCT Pub. No.: WO2023/234313
PCT Pub. Date: Dec. 7, 2023

(65) Prior Publication Data
US 2025/0174519 A1    May 29, 2025

(30) Foreign Application Priority Data
Jun. 1, 2022 (JP) .................... 2022-089903

(51) Int. Cl.
*H01L 23/40* (2006.01)
*F16B 1/00* (2006.01)

(52) U.S. Cl.
CPC .......... *H01L 23/4006* (2013.01); *F16B 1/00* (2013.01); *H01L 2023/4087* (2013.01)

(58) Field of Classification Search
CPC ........ H01N 10/17; H01N 10/13; F01N 5/025; F28D 21/003; H01L 23/4006
See application file for complete search history.

(56) References Cited

U.S. PATENT DOCUMENTS

| 9,997,693 | B2 | 6/2018 | Contet et al. |
| 2016/0079145 | A1 | 3/2016 | Nakagawa |
| 2017/0365763 | A1* | 12/2017 | Contet ................ F28D 21/0003 |
| 2018/0083180 | A1* | 3/2018 | Ganz ..................... H10N 10/17 |
| 2018/0166357 | A1* | 6/2018 | Machler ................. H01L 25/11 |
| 2019/0003775 | A1* | 1/2019 | Lin ..................... F28D 15/0275 |

(Continued)

FOREIGN PATENT DOCUMENTS

| EP | 2044862 | 4/2009 |
| JP | S52-074953 U | 6/1977 |
| JP | S63-110734 U | 7/1988 |

(Continued)

OTHER PUBLICATIONS

International Search Report for PCT/JP2023/020139 mailed on Aug. 15, 2023.

(Continued)

*Primary Examiner* — Daniel J Wiley
(74) *Attorney, Agent, or Firm* — IPUSA, PLLC

(57) ABSTRACT

An elastic member having a plate-like shape, includes a plurality of disc springs arranged side by side in a plane; and a support part integrally provided with the plurality of disc springs in the plane and around the plurality of disc springs, and supporting the plurality of disc springs.

11 Claims, 8 Drawing Sheets

(56) References Cited

U.S. PATENT DOCUMENTS

2019/0259632 A1* 8/2019 Isaacs ................. H01L 23/3677
2023/0063990 A1* 3/2023 So ..................... H01L 23/49827

FOREIGN PATENT DOCUMENTS

| | | |
|---|---|---|
| JP | H07-025533 U | 5/1995 |
| JP | H11-288641 | 10/1999 |
| JP | 4286034 | 6/2009 |
| JP | 2013-110241 | 6/2013 |
| JP | 2016-059238 | 4/2016 |
| JP | 6197769 | 9/2017 |
| WO | 2013/122215 | 8/2013 |

OTHER PUBLICATIONS

Notice of Reasons for Refusal for JP2022-089903 issued on Aug. 22, 2022.
Decision to Grant a Patent for JP2022-089903 issued on Dec. 1, 2022.
Notice of Reason for Revocation for JP2022-089903 issued on Sep. 26, 2023.

\* cited by examiner

FIG.5

| DISPLACEMENT AMOUNT [mm] | LOAD [N] |
|---|---|
| 0.00 | 0 |
| 0.02 | 87 |
| 0.06 | 219 |
| 0.11 | 387 |
| 0.15 | 540 |
| 0.20 | 678 |
| 0.25 | 801 |
| 0.30 | 909 |
| 0.35 | 999 |
| 0.39 | 1075 |
| 0.44 | 1137 |
| 0.49 | 1187 |
| 0.54 | 1226 |
| 0.59 | 1256 |
| 0.63 | 1277 |
| 0.68 | 1291 |
| 0.73 | 1343 |
| 0.78 | 1299 |
| 0.83 | 1296 |
| 0.87 | 1288 |
| 0.92 | 1279 |
| 0.97 | 1267 |
| 0.99 | 1267 |
| 1.03 | 1293 |
| 1.08 | 1401 |
| 1.12 | 1652 |
| 1.17 | 1667 |
| 1.20 | 1996 |

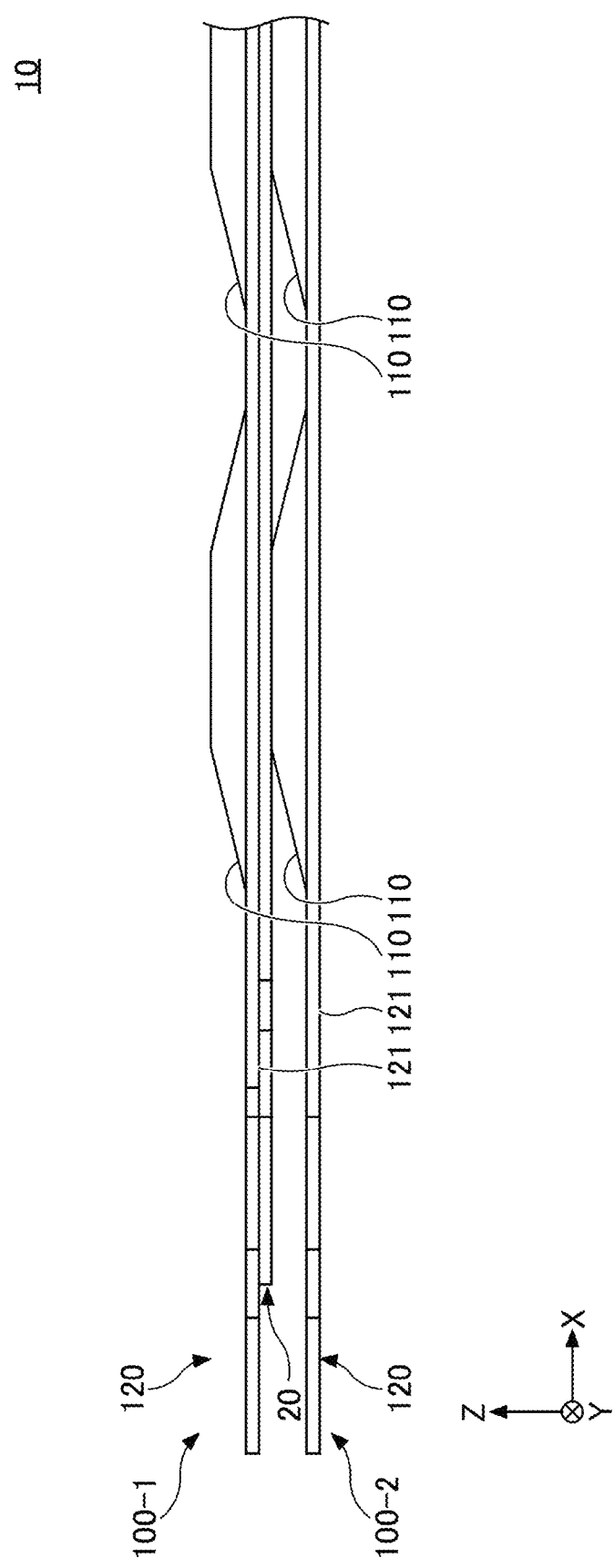

ELASTIC MEMBER AND ELASTIC DEVICE

TECHNICAL FIELD

The present invention relates to an elastic member and an elastic device.

BACKGROUND ART

Patent Document 1 discloses a technology for fixing a semiconductor module to a heat sink in a state where the heat radiation surface of the semiconductor module is pressed against the heat sink, by sandwiching the semiconductor module between the heat sink and a spring-like pressing plate, in a semiconductor device.

CITATION LIST

Patent Document

Patent document 1: Japanese Unexamined Patent Application Publication No. 2013-110241

SUMMARY OF INVENTION

Technical Problem

However, because the technology of Patent Document 1 uses a simple thin metal plate as a pressing plate, the semiconductor module cannot be pushed strongly against the heat sink. Therefore, the technology of Patent Document 1 may cause rattling of the semiconductor module or decrease the cooling efficiency of the semiconductor module.

In recent years, in order to realize miniaturization of various devices such as semiconductor modules, an elastic member which can be arranged in a narrow gap and which can apply a high load is required; however, with the pressing plate of Patent Document 1, even if the pressing plate can be arranged in a narrow gap, the pressing plate cannot apply a high load.

In order to solve the above-mentioned problem, an object of the present invention is to provide an elastic member capable of applying a high load in a narrow gap.

Solution to Problem

In order to solve the problems described above, the elastic member according to one embodiment is an elastic member having a plate-like shape, including a plurality of disc springs arranged side by side in a plane; and a support part integrally provided with the plurality of disc springs in the plane and around the plurality of disc springs, and supporting the plurality of disc springs.

Advantageous Effects of Invention

According to an elastic member according to an embodiment, it is possible to provide an elastic member capable of applying a high load in a narrow gap.

BRIEF DESCRIPTION OF DRAWINGS

FIG. 5 is a table illustrating an analysis result of load characteristics of an elastic device according to an embodiment.

FIG. 9 is a diagram illustrating a modified example of an elastic device according to an embodiment.

DESCRIPTION OF EMBODIMENTS

An embodiment of the present invention will now be described with reference to the drawings.

Configuration of Elastic Device 10

Figure 1:
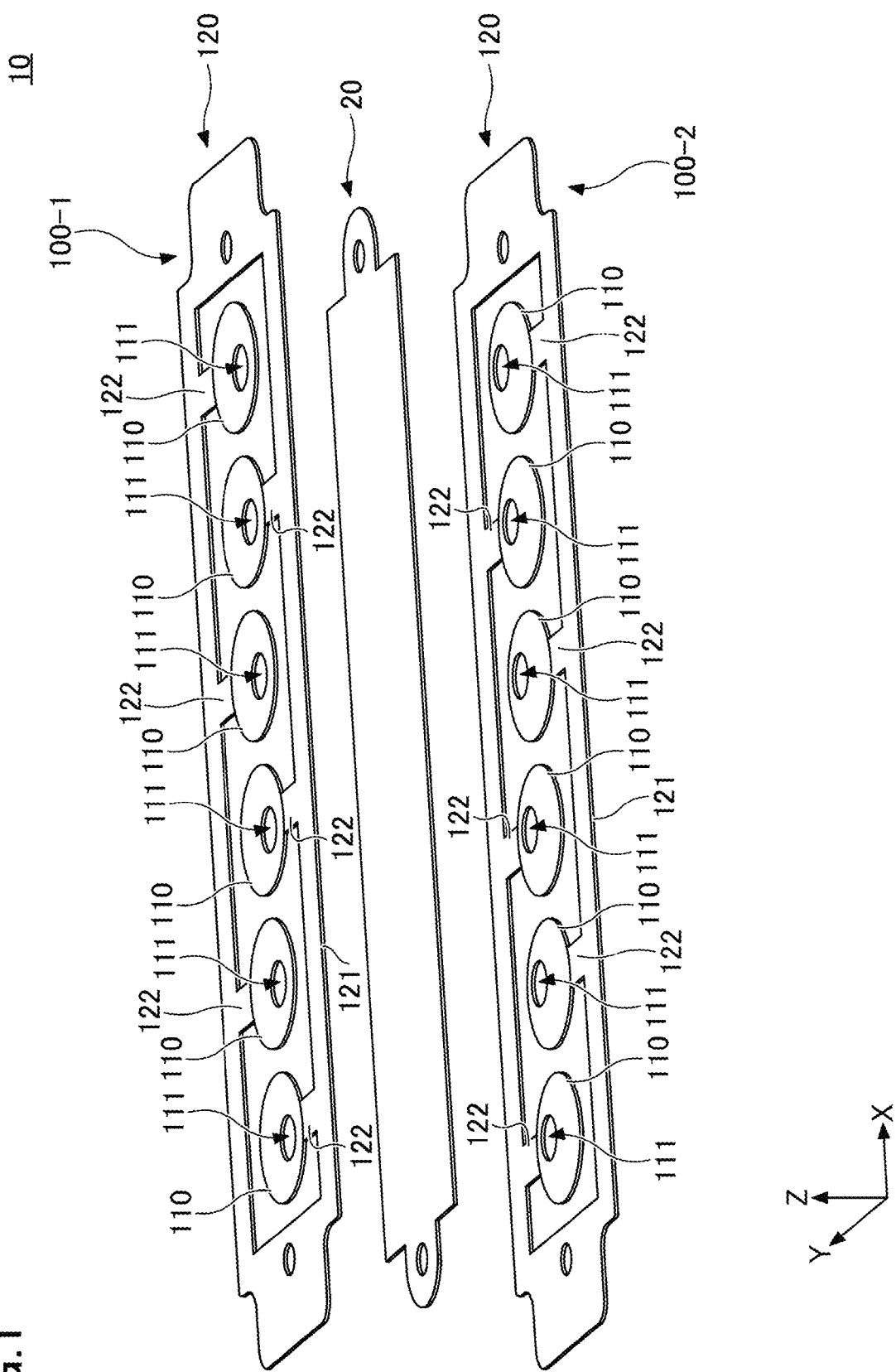
FIG. 1 is an exploded perspective view of an elastic device according to an embodiment.
Figure 2:
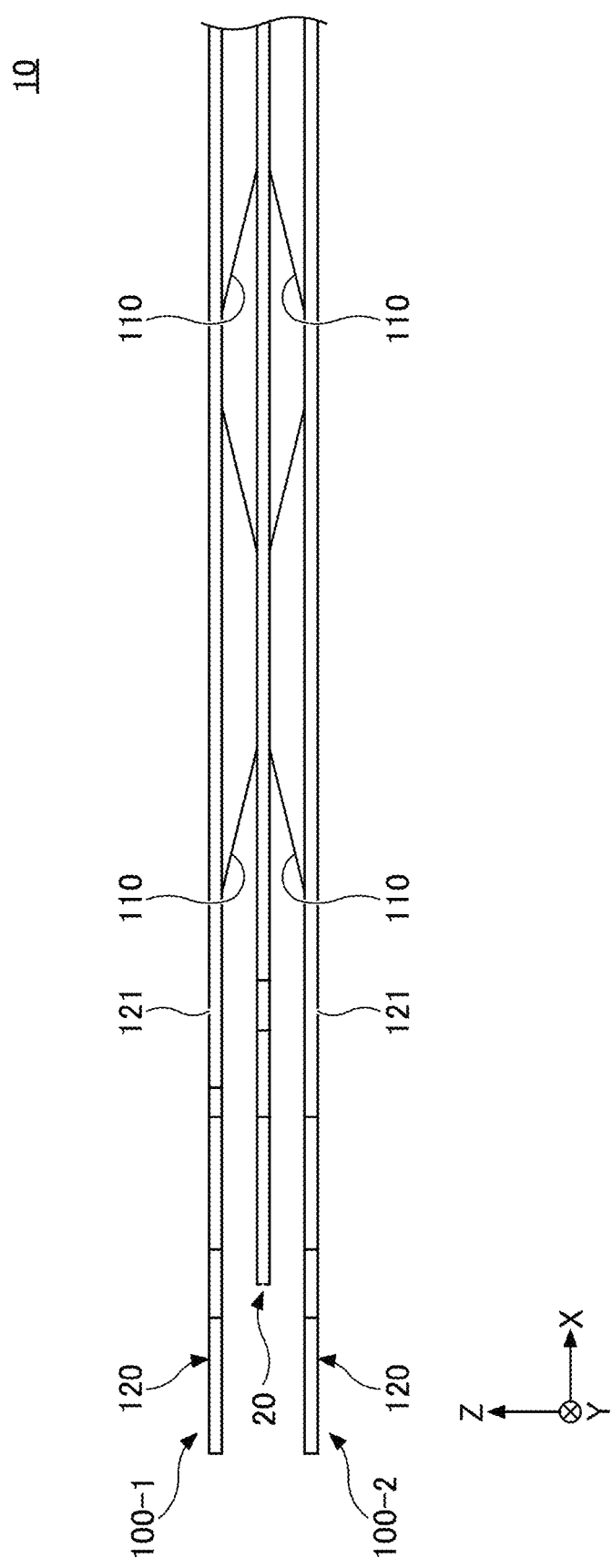
FIG. 2 is a partial enlarged side view of an elastic device according to an embodiment.

FIG. 1 is an exploded perspective view of an elastic device 10 according to an embodiment. FIG. 2 is a partial enlarged side view of the elastic device 10 according to an embodiment.

As illustrated in FIG. 1, the elastic device 10 according to an embodiment is generally thin and planar. The elastic device 10 includes two elastic members 100 (elastic members 100-1, 100-2) and an intermediate plate 20. The elastic device 10 has a laminated structure in which the intermediate plate 20 is sandwiched between the two elastic members 100. Although the two elastic members 100 are parts identical to each other, they are used in a state in which the front and back of each other are inverted.

In the present embodiment, for convenience, the thickness direction of the elastic device 10 is set as the vertical direction (Z-axis direction), the longitudinal direction of the elastic device 10 is set as the horizontal direction (X-axis direction), and the transverse direction of the elastic device 10 is set as the front back direction (Y-axis direction).

The elastic member 100 is a metal flat plate member having a rectangular outer shape with the longitudinal direction in the horizontal direction (X-axis direction) in a plan view. The elastic member 100 has a plurality of disc springs 110 and a support part 120.

The plurality of disc springs 110 are arranged in a line in the horizontal direction (X-axis direction) and in the same plane, in the frame of a base part 121 of the support part 120.

The disc springs 110 are disc-shaped members having a circular opening 111 in the center and having elasticity in the vertical direction (Z-axis direction). The disc springs 110 have a shape that gradually rises in the vertical direction (Z-axis direction) from the outer periphery toward the inner periphery. That is, the disc spring 110 has a trapezoidal shape with a central top. Thus, the disc spring 110 is elastically deformable in the vertical direction (Z-axis direction) so that the vertical width is reduced by pressing the top (that is, the central portion where the opening 111 is provided). Further, the disc spring 110 can apply a high load to an object against which the disc spring 110 is pressed by its own elastic force.

The number and arrangement of the disc springs 110 are not limited to those illustrated in FIG. 1. For example, in the example illustrated in FIG. 1, the elastic member 100 has six disc springs 110. However, the number of disc springs is not limited thereto, and the elastic member 100 may have five or fewer disc springs, or seven or more disc springs 110. In the example illustrated in FIG. 1, the elastic member 100 has a plurality of disc springs 110 arranged in a row in the longitudinal direction (X-axis direction); however, the arrangement is not limited thereto, and the elastic member 100 may have a plurality of disc springs 110 arranged in plural rows in the longitudinal direction (X-axis direction).

In the example illustrated in FIG. 1, the elastic member 100 has a plurality of disc springs 110 arranged in a straight line, but the arrangement is not limited thereto, and the elastic member 100 may have two adjacent disc springs 110 offset in the transverse direction (Y-axis direction). In this case, the elastic member 100 can arrange the same number of disc springs 110 within a shorter range in the longitudinal direction (X-axis direction).

The support part 120 is shaped as a flat-plate rectangular frame. The support part 120 is integrally provided with the plurality of disc springs 110, in the same plane as the plurality of disc springs 110 and around the plurality of disc springs 110, and supports the plurality of disc springs 110. The support part 120 has a frame-like base part 121 and supports the plurality of disc springs 110 within the frame of the base part 121. Specifically, the support part 120 has a connection part 122 connecting the base part 121 and the disc spring 110, with respect to each of the plurality of disc springs 110 within the frame of the base part 121. In the example illustrated in FIG. 1, the support part 120 has connection parts 122 connecting disc springs 110 to the portion of the base part 121 on the positive Y-axis side and connection parts 122 connecting disc springs 110 to the portion of the base part 121 on the negative Y-axis side, with these connection parts 122 being provided alternately in the horizontal direction (X-axis direction).

In the example illustrated in FIG. 1, the base part 121 has a rectangular frame shape with the horizontal direction (X-axis direction) as the longitudinal direction. However, the base part 121 is not limited thereto, and the base part 121 may have a frame shape other than a rectangular shape (for example, square, circular, etc.). The base part 121 may have a shape other than a frame shape (for example, linear).

The elastic member 100 is formed by using any metal material (for example, stainless steel). By press-processing one metal plate, the elastic member 100 can be formed at once to have a plurality of disc springs 110 and the support part 120. For example, in the present embodiment, the elastic member 100 is formed at once to have a plurality of disc springs 110 and the support part 120 by press-processing a stainless steel plate having a thickness of 0.5 [mm], for example. It is also possible to manufacture a plurality of elastic members 100 at once by press-processing a single metal plate.

The intermediate plate 20 is a plate-like member having a rectangular shape whose longitudinal direction is in the horizontal direction (X-axis direction) in a plan view. The intermediate plate 20 is formed by using any metal material (for example, stainless steel).

As illustrated in FIGS. 1 and 2, in the elastic device 10, the elastic member 100-1 provided on the upper side (positive Z-axis side) is arranged so that the tops of all the disc springs 110 face downward. On the other hand, in the elastic device 10, the elastic member 100-2 provided on the lower side (negative Z-axis side) is arranged so that the tops of all the disc springs 110 face upward.

In the elastic device 10, as illustrated in FIG. 2, the intermediate plate 20 is arranged between the two elastic members 100 so as to be sandwiched between the tops of the disc springs 110 facing downward and provided on the upper side (positive Z-axis side) and the tops of the disc springs 110 facing upward and provided on the lower side (negative z-axis side).

The elastic member 100 according to one embodiment has six disc springs 110, and, therefore, it is possible to obtain a load six times larger than that obtained by one disc spring 110, while being thin overall.

Further, the elastic member 100 according to one embodiment is thin and flat overall, and, therefore, it is possible to be installed within a narrow gap and to apply a high load evenly over a wide range within the gap.

Further, the elastic member 100 according to one embodiment has a plurality of disc springs 110, and, therefore, the overall load can be easily adjusted by adjusting the number, the arrangement, the shape, the outer diameter, the inner diameter, etc. of the disc springs 110. In the example illustrated in FIG. 1, the plurality of disc springs 110 have the same shape and the same size, but the plurality of disc springs 110 are not limited thereto, and the plurality of disc springs 110 may have different shapes and different sizes.

In the elastic member 100 according to one embodiment, the plurality of disc springs 110 are supported by the support part 120, and, therefore, the plurality of disc springs 110 can be maintained at a predetermined position, and because the plurality of disc springs 110 will not be separated from each other, the handling of the plurality of disc springs 110 can be facilitated.

In the elastic device 10 according to one embodiment, the two elastic members 100 are overlapping, and, therefore, the overall deflection amount can be doubled while the height dimension of each disc spring 110 is reduced. In the elastic device 10 according to one embodiment, by reducing the height dimension of each disc spring 110, it is possible to make it difficult to invert the disc spring 110.

Further, in the elastic device 10 according to one embodiment, two elastic members 100 are overlapped so that the tops of the plurality of disc springs 110 of the elastic member 100-1 on the upper side (positive z-axis side) and the tops of the plurality of disc springs 110 of the elastic member 100-2 on the lower side (positive Z-axis side) face each other. Therefore, the elastic device 10 according to one embodiment can double the overall deflection amount while making the overall load obtained equal to the load obtained by one elastic member 100.

The elastic device 10 according to one embodiment has a thin and flat shape as a whole, and, therefore, the elastic device 10 can be installed in a narrow gap, and a high load can be applied evenly over a wide range in the gap.

Further, the elastic device 10 according to one embodiment has an intermediate plate 20 between two elastic members 100, and, therefore, the tops of the respective disc springs 110 can be pressed against the surface of the intermediate plate 20 reliably and evenly, that is, the load from the respective disc springs 110 can be received reliably by the intermediate plate 20.

The elastic device 10 according to one embodiment has an intermediate plate 20 between the two elastic members 100, and, therefore, the overall thickness can be easily adjusted by adjusting the thickness of the intermediate plate 20.

In the elastic device 10 according to one embodiment, the two elastic members 100 may be overlapped so that the bottom portions of the plurality of disc springs 110 of the elastic member 100-1 on the upper side (positive Z-axis side) and the bottom portions of the plurality of disc springs 110 of the elastic member 100-2 on the lower side (positive Z-axis side) face each other. In this case, the elastic device 10 according to one embodiment can double the overall deflection amount while making the overall load obtained equal to the load obtained by one elastic member 100.

Further, the elastic device 10 according to one embodiment may be provided with two elastic members 100 overlapping, so that the bottom of each of the plurality of disc springs 110 of the elastic member 100-1 on the upper side (positive Z-axis side) and the top of each of the plurality of disc springs 110 of the elastic member 100-2 on the lower side (positive Z-axis side) face each other. In this case, the elastic device 10 according to one embodiment can double the overall deflection amount while making the overall load obtained to be double that obtained by one elastic member 100.

On the other hand, the elastic device 10 according to one embodiment may be provided with two elastic members 100 overlapping so that the tops of the plurality of disc springs 110 of the elastic member 100-1 on the upper side (positive Z-axis side) and the bottoms of the plurality of disc springs 110 of the elastic member 100-2 on the lower side (positive Z-axis side) face each other. In this case, the elastic device 10 according to one embodiment can double the overall deflection amount while making the overall load obtained be double that obtained by the single elastic member 100.

Another Configuration Example of the Elastic Device 10

Figure 3:
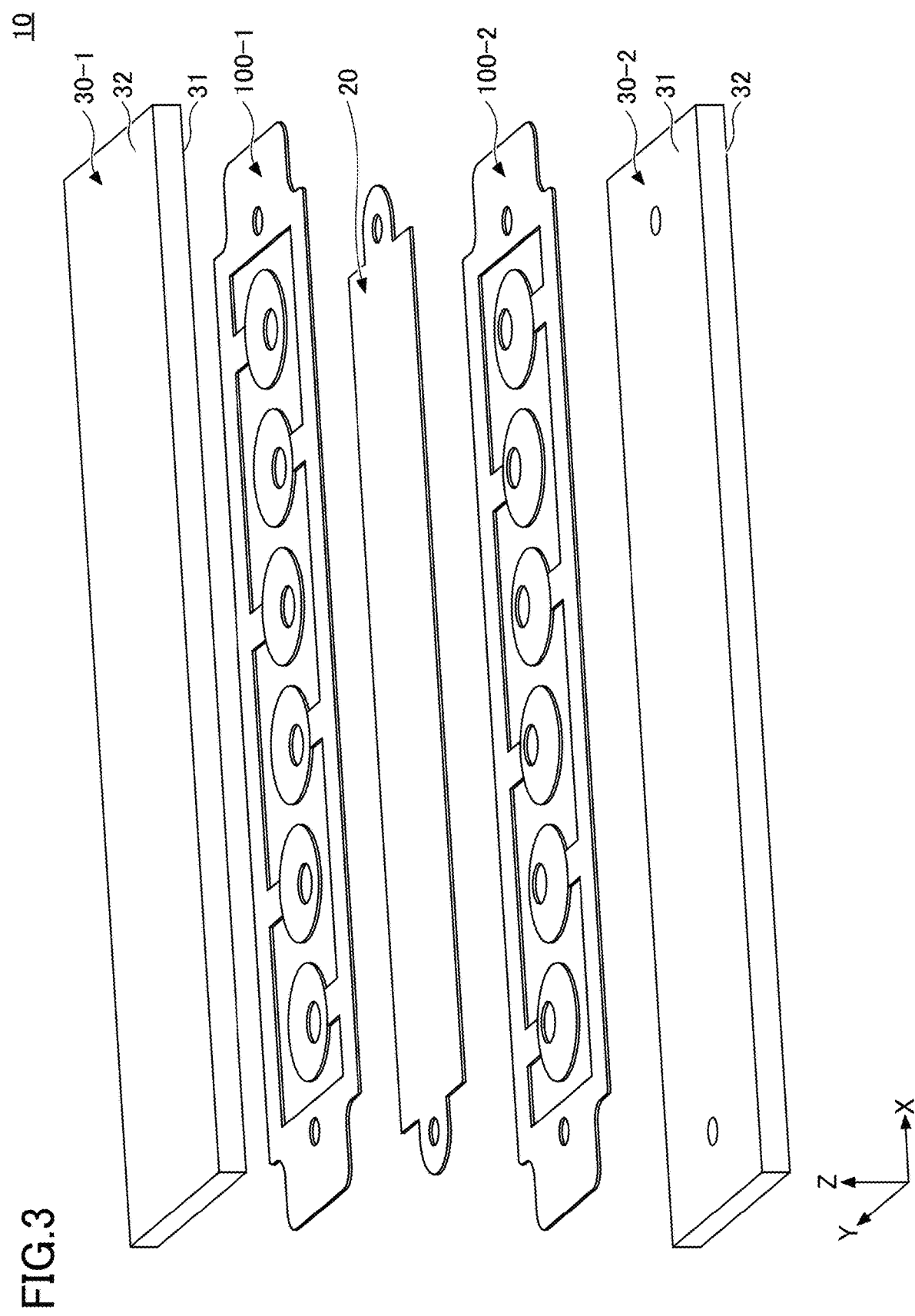
FIG. 3 is an exploded perspective view illustrating another configuration example of an elastic device according to an embodiment.
Figure 4:
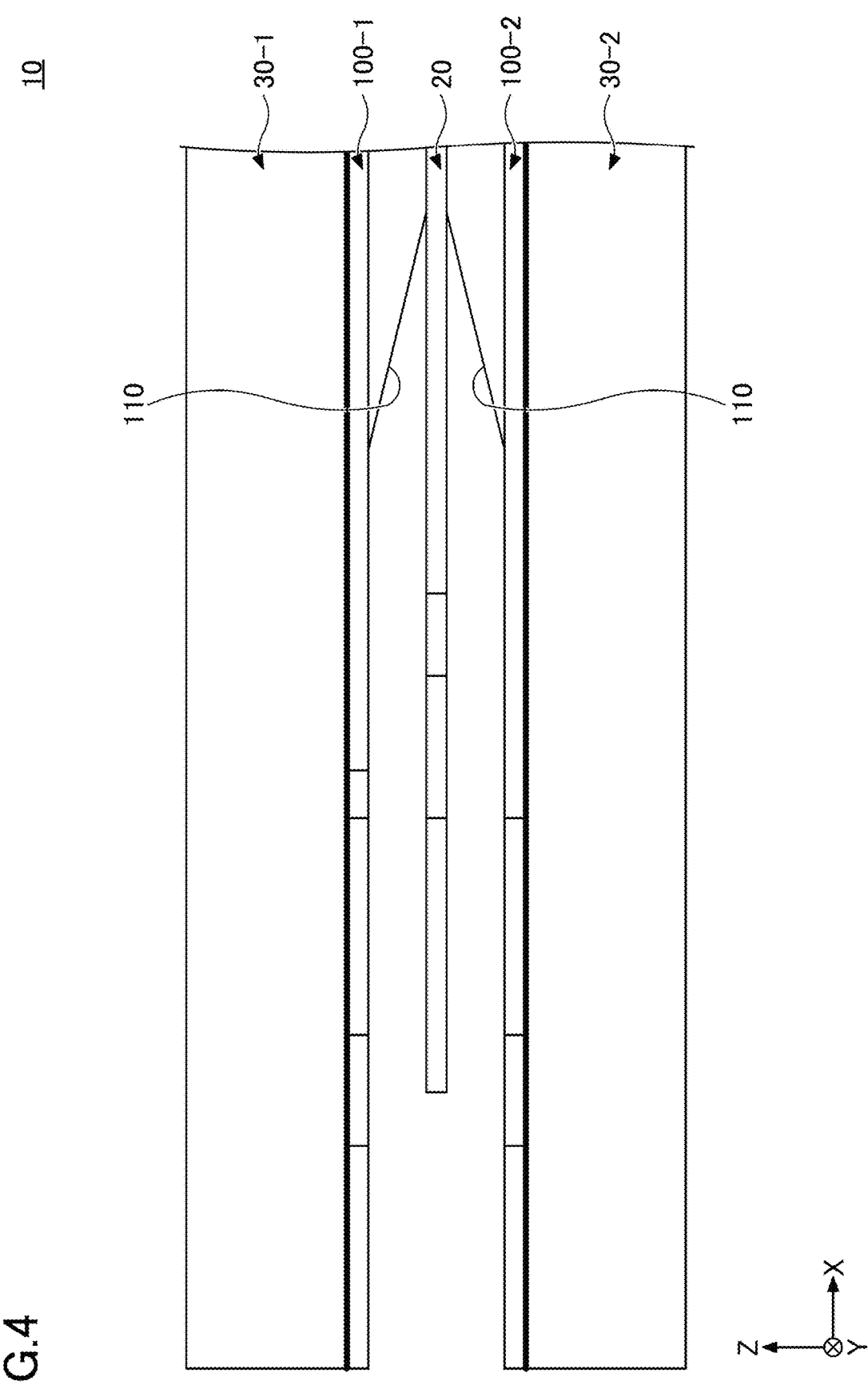
FIG. 4 is a partial enlarged side view illustrating another configuration example of an elastic device according to an embodiment.

FIG. 3 is an exploded perspective view illustrating another configuration example of the elastic device 10 according to an embodiment. FIG. 4 is a partial enlarged side view illustrating another configuration example of the elastic device 10 according to an embodiment.

The elastic device 10 illustrated in FIGS. 3 and 4 has a flat plate-like rigid body 30 at the top (upper side of the elastic member 100-1) and at the bottom (lower side of the elastic member 100-2). That is, the elastic device 10 illustrated in FIG. 4 has a configuration in which the elastic device 10 illustrated in FIG. 1 is sandwiched between two rigid bodies 30 (rigid bodies 30-1, 30-2).

Each of the two rigid bodies 30 has a first surface 31 facing inward and facing the plurality of disc springs 110, and a second surface 32 facing outward and facing an object to receive a load applied from the elastic device 10, on the reverse side of the first surface. Each of the two rigid bodies 30 is formed with a constant thickness so as to be difficult to elastically deform, using any metal material.

The elastic device 10 illustrated in FIG. 4, having two rigid bodies 30, can receive the load applied from the plurality of disc springs 110 on the entire first surface 31 of each of the two rigid bodies 30, and apply the load evenly to the object by the entire second surface of each of the two rigid bodies 30.

Load Characteristics of the Elastic Device 10

Figure 6:
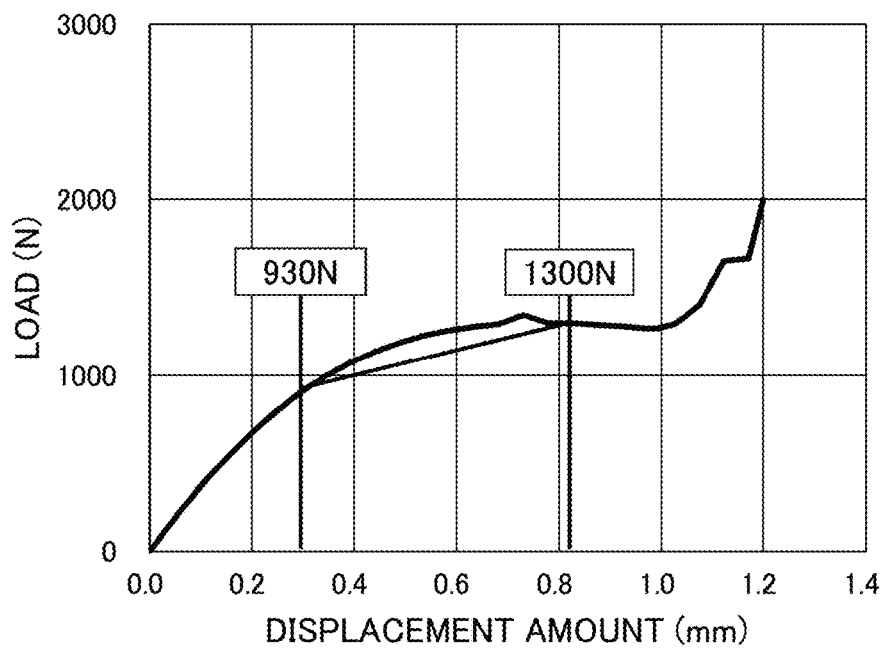
FIG. 6 is a graph illustrating an analysis result of load characteristics of an elastic device according to an embodiment.

FIG. 5 is a table indicating an analysis result of load characteristics of the elastic device 10 according to an embodiment. FIG. 6 is a graph indicating an analysis result of load characteristics of the elastic device 10 according to an embodiment.

The length of the elastic device 10 of the present analysis result in the longitudinal direction (X-axis direction) is 135 [mm], and the width in the transverse direction (Y-axis direction) is 35 [mm].

The thickness of the elastic device 10 of the present analysis result is 2.72 [mm] when not pressed, which is extremely thin.

In the elastic device 10 of the present analysis result, the height, the outer diameter, and the inner diameter of each disc spring 110 are adjusted so as to satisfy the following performance requirements (1) and (2).

A load 930 [N] can be obtained with a displacement amount of 0.3 [mm] . . . (1)

A load 1300 [N] can be obtained with a displacement amount of 0.82 [mm] . . . (2)

As illustrated in FIGS. 5 and 6, it was confirmed that the elastic device 10 of the present analysis result can obtain an extremely high load of 930 [N] when the thickness at the time of pressing is 2.42 [mm] (that is, the displacement amount is 0.3 [mm]), and can satisfy the required performance.

As illustrated in FIGS. 5 and 6, it was confirmed that the elastic device 10 of the present analysis result can obtain an extremely high load of 1300 [N] when the thickness at the time of pressing is 1.9 [mm] (that is, the displacement amount is 0.82 [mm]), and can satisfy the required performance.

As illustrated in FIGS. 5 and 6, the elastic device 10 of the present analysis result has a first load characteristic from a displacement amount of 0 to 0.3 [mm] (an example of the "first value") and a second load characteristic from a displacement amount of 0.3 [mm] to 0.82 [mm] (an example of the "second value"), and the first load characteristic has a higher rate of increase in load than the second load characteristic. That is, the elastic device 10 of the present analysis result can obtain a high load with a relatively small displacement amount after the pressing is started.

One Use Example of the Elastic Member 100

Figure 7:
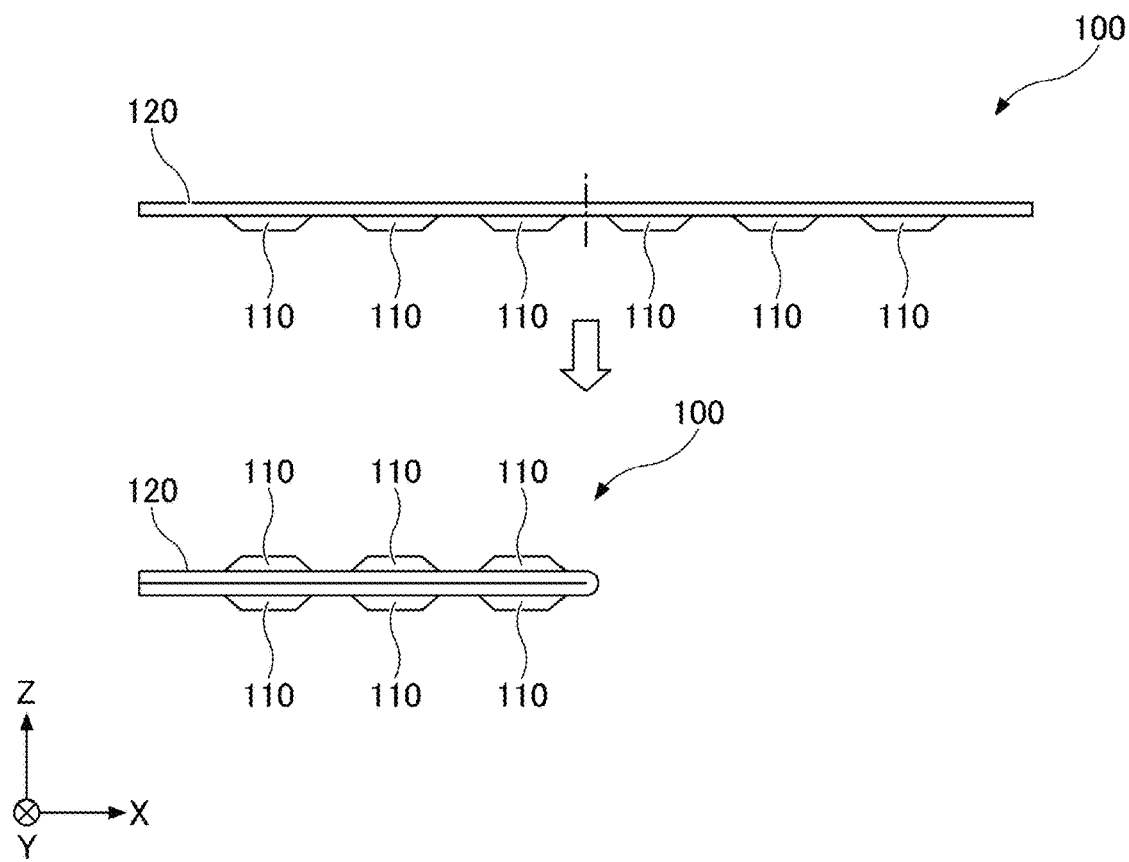
FIG. 7 is a diagram illustrating an example of use of an elastic member according to an embodiment.

FIG. 7 is a diagram illustrating one use example of the elastic member 100 according to an embodiment. As illustrated in FIG. 7, in the elastic member 100 according to an embodiment, a plurality of disc springs 110 are connected by a support part 120, and, therefore, the three disc springs 110 and the other three disc springs 110 can be overlapped by folding back the support part 120 at an intermediate position in the longitudinal direction (X-axis direction), and the overall thickness can be doubled.

One Modified Example of the Elastic Member 100

Figure 8:
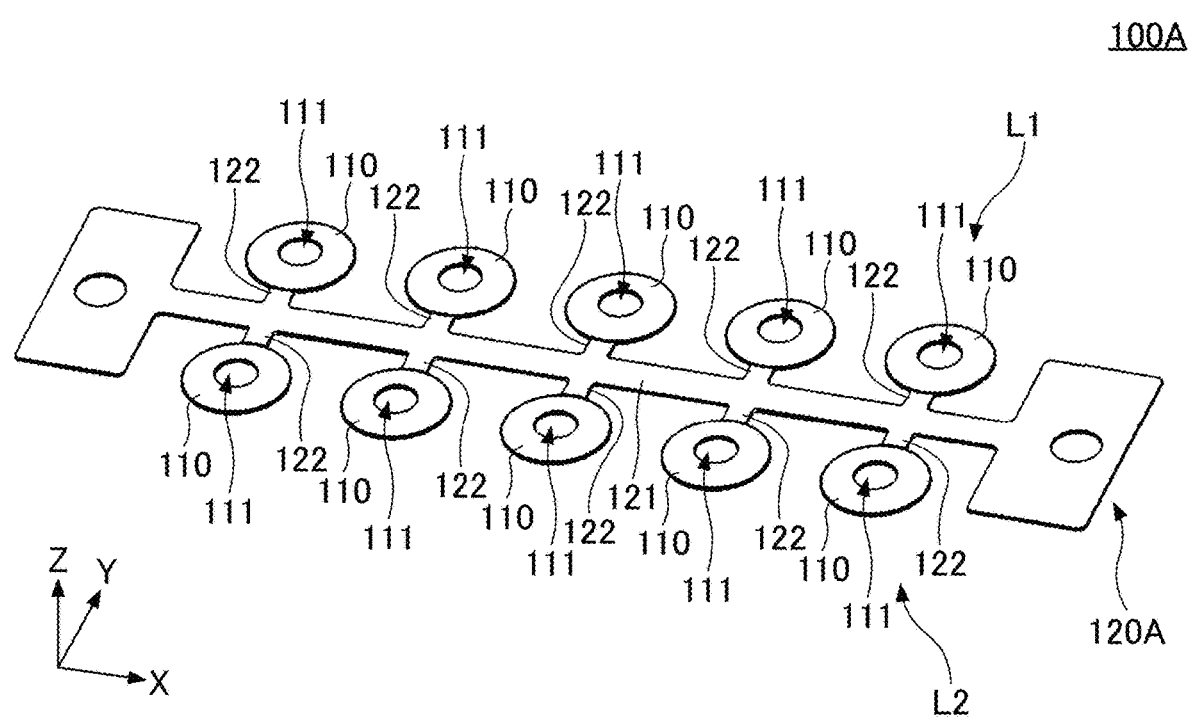
FIG. 8 is a diagram illustrating a modified example of an elastic member according to an embodiment.

FIG. 8 is a diagram illustrating an elastic member 100A which is one modified example of the elastic member 100 according to an embodiment.

In a plan view, the elastic member 100A is a metal flat plate member whose longitudinal direction is in the horizontal direction (X-axis direction). The elastic member 100A has a first disc spring row L1, a second disc spring row L2, and a support part 120A.

The first disc spring row L1 and the second disc spring row L2 are provided in parallel, with the support part 120A between them. The first disc spring row L1 is provided on the positive Y-axis side of the support part 120A. The second disc spring row L2 is provided on the negative Y-axis side of the support part 120A.

Each of the first disc spring row L1 and the second disc spring row L2 has a plurality of disc springs 110 arranged in a row in a horizontal direction (X-axis direction) in the same plane. The disc spring 110 provided in the elastic member 100A is the same as the disc spring 110 provided in the elastic member 100.

In the first disc spring row L1 and the second disc spring row L2, the number of disc springs 110 is not limited to those illustrated in FIG. 8. For example, in the example illustrated in FIG. 8, the first disc spring row L1 and the second disc spring row L2 each have five disc springs 110. However, the number of disc springs is not limited thereto, and the first disc spring row L1 and the second disc spring row L2 may each have four or less or six or more disc springs 110.

In the example illustrated in FIG. 8, the first disc spring row L1 and the second disc spring row L2 may each have a plurality of disc springs 110 arranged in a straight line, but the arrangement is not limited thereto, and the first disc spring row L1 and the second disc spring row L2 may each have two adjacent disc springs 110 offset in the transverse direction (Y-axis direction). In this case, the same number of disc springs 110 can be arranged in the first disc spring row L1 and the second disc spring row L2 within a shorter range in the longitudinal direction (X-axis direction).

The support part 120A is provided integrally with the plurality of disc springs 110 in the same plane as the plurality of disc springs 110 and between the first disc spring row L1 and the second disc spring row L2 to support the plurality of disc springs 110. The support part 120A has a base part 121 extending linearly in the horizontal direction (X-axis direction) and supports the plurality of disc springs 110 on both outer sides of the base part 121. Specifically, the support part 120A has a connection part 122 connecting the base part 121 and the disc spring 110, for each of the plurality of disc springs 110 on both outer sides of the base part 121. In the example illustrated in FIG. 8, the support part 120A has a plurality of connection parts 122 connecting the plurality of disc springs 110 held by the first disc spring row L1 to the base part 121 on the first disc spring row L1 side (positive Y-axis side) relative to the base part 121, and has a plurality of connection parts 122 connecting the plurality of disc springs 110 held by the second disc spring row L2 to the base part 121 on the second disc spring row L2 side (negative Y-axis side) relative to the base part 121.

The elastic member 100A is formed by using any metal material (for example, stainless steel). By press-processing one metal plate, the elastic member 100A can be formed at once to have a plurality of disc springs 110 and the support part 120A. For example, in the present embodiment, the elastic member 100A is formed at once to have a plurality of disc springs 110 and the support part 120A by, for example, press-processing a stainless steel plate having a thickness of 0.5 [mm]. It is also possible to manufacture a plurality of elastic members 100A at once by press-processing a single metal plate.

The elastic device 10 according to one embodiment may use the elastic member 100A instead of the elastic member 100. Also in this case, the elastic device 10 according to one embodiment can achieve the same effect as when the elastic member 100 is used.

One Modified Example of the Elastic Device 10

FIG. 9 is a diagram illustrating one modified example of the elastic device 10 according to an embodiment. In the elastic device 10 according to an embodiment, two elastic members 100, which are parts identical to each other, may be overlapping without inverting each other.

For example, as illustrated in FIG. 9, in the elastic device 10 according to an embodiment, two elastic members 100 may be overlapping with an intermediate plate 20 therebetween so that the tops of the plurality of disc springs 110 of the elastic member 100-1 on the upper side (positive Z-axis side) face upward and the tops of the plurality of disc springs 110 of the elastic member 100-2 on the lower side (negative Z-axis side) face upward.

In this case, the elastic device 10 according to one embodiment can double the overall deflection amount while making the overall load obtained equal to the load obtained by one elastic member 100.

Although the preferred embodiments of the present invention have been described in detail above, the present invention is not limited to these embodiments and can be modified or changed in various ways within the scope of the gist of the present invention described in the claims.

For example, the elastic member 100, 100A may be used separately or incorporated into the elastic device 10.

The elastic device 10 may have a configuration in which three or more elastic members 100, 100A are overlapping. In this case, the elastic device 10 may have the intermediate plate 20 between two elastic members 100, 100A overlapping each other.

The present international application claims priority to Japanese Patent Application No. 2022-089903 filed on Jun. 1, 2022, the entire contents of which are incorporated herein by reference.

REFERENCE SIGNS LIST 10 elastic device
20 intermediate plate
30, 30-1, 30-2 rigid body
100, 100-1, 100-2, 100A elastic member
110 disc spring
111 opening
120, 120A support part
121 base part
122 connecting part

The invention claimed is:

1. An elastic member having a plate-like shape, comprising:
a plurality of disc springs arranged side by side in a plane; and
a support part integrally provided with the plurality of disc springs in the plane and around the plurality of disc springs, and supporting the plurality of disc springs, wherein
the support part includes a base part having a frame-like shape and holds the plurality of disc springs within a frame of the base part such that each disc spring is connected at one end to the base part but unsupported at other ends by the support part without being connected to the base part.

2. The elastic member according to claim 1, wherein the base part has a rectangular frame-like shape.

3. The elastic member according to claim 2, wherein the plurality of disc springs are arranged side by side in the frame of the base part of the support part along a longitudinal direction of the base part.

4. An elastic member having a plate-like shape, comprising:
a plurality of disc springs arranged side by side in a plane; and a support part integrally provided with the plurality of disc springs in the plane and around the plurality of disc springs, and supporting the plurality of disc springs, wherein the support part includes a base part having a linear shape, and holds the plurality of disc springs at both outer sides of the base part such that each disc spring is connected at one end to the base part but unsupported at other ends by the support part without being connected to the base part.

5. The elastic member according to claim 4, wherein the plurality of disc springs are arranged side by side along a longitudinal direction of the base part at both outer sides of the base part of the support part.

6. An elastic device comprising:
two of the elastic members according to claim 5, the elastic members being provided to overlap each other.

7. The elastic device according to claim 6, wherein the two elastic members are provided to overlap each other such that tops of the plurality of disc springs provided in one elastic member of the two elastic members and tops of the plurality of disc springs provided in another elastic member of the two elastic members face each other.

8. The elastic device according to claim 7, further comprising:
an intermediate plate arranged between the two elastic members.

9. The elastic device according to claim 6, wherein the two elastic members are provided to overlap each other such that tops of the plurality of disc springs provided in one elastic member of the two elastic members and tops of the plurality of disc springs provided in another elastic member of the two elastic members are oriented in a same direction.

10. The elastic device according to claim 9, further comprising:
an intermediate plate arranged between the two elastic members.

11. The elastic device according to claim 6, wherein:
a first load characteristic represents a rate of load increase relating to a displacement amount of the elastic device when a thickness value of the elastic device at the time of being pressed is between 0 to a first value; and
a second load characteristic represents the rate of load increase relating to a displacement amount of the elastic device when the thickness value of the elastic device at the time of being pressed is between the first value to a second value, wherein
the first load characteristic has a higher rate of load increase than the second load characteristic.

\* \* \* \* \*